(12) United States Patent
Torti

(10) Patent No.: US 9,099,190 B2
(45) Date of Patent: Aug. 4, 2015

(54) NON-VOLATILE MEMORY DEVICE WITH IMPROVED READING CIRCUIT

(71) Applicant: STMICROELECTRONICS S.R.L., Agrate Brianza (IT)

(72) Inventor: Cesare Torti, Pavia (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/305,482

(22) Filed: Jun. 16, 2014

(65) Prior Publication Data

US 2015/0003168 A1    Jan. 1, 2015

(30) Foreign Application Priority Data

Jun. 26, 2013 (IT) .............................. MI2013A1060

(51) Int. Cl.
| | |
|---|---|
| *G11C 16/06* | (2006.01) |
| *G11C 16/26* | (2006.01) |
| *G11C 16/28* | (2006.01) |
| G11C 11/56 | (2006.01) |
| G11C 7/06 | (2006.01) |

(52) U.S. Cl.
CPC ................ *G11C 16/26* (2013.01); *G11C 7/062* (2013.01); *G11C 7/067* (2013.01); *G11C 16/28* (2013.01); *G11C 7/065* (2013.01); *G11C 11/5642* (2013.01)

(58) Field of Classification Search
CPC .... G11C 16/26; G11C 11/5642; G11C 16/28; G11C 7/065

USPC ........... 365/185.21, 205, 189.05, 207, 189.07
See application file for complete search history.

(56) References Cited

U.S. PATENT DOCUMENTS

| | | | |
|---|---|---|---|
| 7,272,062 B2 | 9/2007 | Taddeo | |
| 7,508,716 B2 | 3/2009 | Pasotti et al. | |
| 7,515,493 B2 | 4/2009 | Di Vincenzo et al. | |
| 7,567,463 B2 * | 7/2009 | Hosono et al. ........... | 365/185.21 |

FOREIGN PATENT DOCUMENTS

EP       1505605 A1    2/2005

* cited by examiner

*Primary Examiner* — David Lam
(74) *Attorney, Agent, or Firm* — Allen, Dyer, Doppelt, Milbrath & Gilchrist, P.A.

(57) ABSTRACT

A non-volatile memory device includes a sense amplifier for comparing a conduction current of a selected one of a plurality of memory cells with a reference current. The sense amplifier includes an amplification stage having a first input terminal for receiving a first comparison voltage, a second input terminal for receiving a reference value, and an output terminal for providing a second comparison voltage. A buffer stage has an output terminal for providing a comparison current according to a difference between the conduction current and the reference current, and an input terminal for stabilizing the first comparison voltage at the reference value and the second comparison voltage at a comparison value unbalanced with respect to the reference value according to the comparison current. A latching stage indicates a logic level stored in the memory cell according to a difference between the comparison value and the reference value.

20 Claims, 4 Drawing Sheets

NON-VOLATILE MEMORY DEVICE WITH IMPROVED READING CIRCUIT

FIELD OF THE INVENTION

The invention relates to the field of electronics, and more specifically, to non-volatile memory devices.

BACKGROUND OF THE INVENTION

Non-volatile memory devices are used in any application that requires the storing of information binary data (or bits) that should be maintained even when the memory devices are not powered. Each non-volatile memory device typically comprises a matrix of memory cells, and peripheral circuits to perform management and access functions, for example, reading circuits comprising sense amplifiers to perform reading operations of selected memory cells.

During a reading operation, each sense amplifier is configured to compare electrical signals through (one or more) selected memory cells to appropriate reference values, and to determine the information bits stored therein according to such comparison. As should be known, the reduced extent of such electrical signals and the presence of capacitive components having high values require a reading operation with different operating phases of the sense amplifier (for example, discharge, pre-charge, equalization, and latch), each one being enabled/disabled by a corresponding phase signal.

The present inventor has observed that such phase signals, generated by a signals generation block, result in some drawbacks that affect the performance of the non-volatile memory device. In fact, the relatively high number of phase signals (typically four or more) needed to control the sense amplifier during the reading operation makes the design of the signals generation block critical, both in terms of performance (as it is necessary to ensure that all phase signals have appropriate speed and accuracy), and in terms of area occupation.

Furthermore, a high number of phase signals requires long times for the configuration (i.e., for setting the corresponding timings) and for the test (as they have to be configured and tested one by one). This determines an increase of the production costs of the non-volatile memory device, and a greater likelihood of introducing errors (during the configuration and/or the test).

The inventor has also noticed that the non-volatile memory devices have limitations in low supply voltages conditions. In fact, to achieve reduced access times and reduced area occupation, the sense amplifiers are typically designed to operate with low supply voltages (typically 1.2-1.8 V). However, as should be known, the supply voltage can reach (in the presence of noise and/or unwanted fluctuations) excessively low values (e.g., lower than 1V). This results in an incorrect operation of the sense amplifiers, and thus errors in the reading operation.

It is noted that known approaches (such as those described in U.S. Pat. No. 7,272,062 and U.S. Pat. No. 7,508,716) may not completely address the cited problems.

SUMMARY OF THE INVENTION

An aspect of the approach according to an embodiment provides a non-volatile memory device including a sense amplifier for comparing, at a comparison node, a conduction current of a selected memory cell with a reference current. The sense amplifier comprises an amplification stage for receiving a first comparison voltage at the comparison node, and a reference value, and for providing a second comparison voltage according to the first comparison voltage and the reference value. A buffer stage provides a comparison current according to a difference between the conduction current and the reference current, and is configured to stabilize (according to the comparison current) the first comparison voltage at the reference value and the second voltage comparison at a comparison value being unbalanced with respect to the reference value. A latching stage is for providing a latched binary data indicative of a logic level stored in the memory cell according to a difference between the comparison value and the reference value.

Another aspect of the approach according to an embodiment of the present invention is directed to a corresponding method.

BRIEF DESCRIPTION OF THE DRAWINGS

The approach according to one or more embodiments of the invention, as well as further features and the advantages thereof, will be best understood with reference to the following detailed description, given purely by way of a non-restrictive indication, to be read in conjunction with the accompanying drawings (wherein, for convenience, corresponding elements are denoted with the same or similar references, and their explanation is not repeated, and the name of each entity is generally used to indicate both type and attributes thereof, such as value, content and representation). In this respect, it is expressly understood that the figures are not necessarily drawn to scale (with some details that may be exaggerated and/or simplified) and that, unless otherwise indicated, they are simply used to conceptually illustrate the described structures and procedures. In particular.

DETAILED DESCRIPTION OF THE PREFERRED EMBODIMENTS

Figure 1:
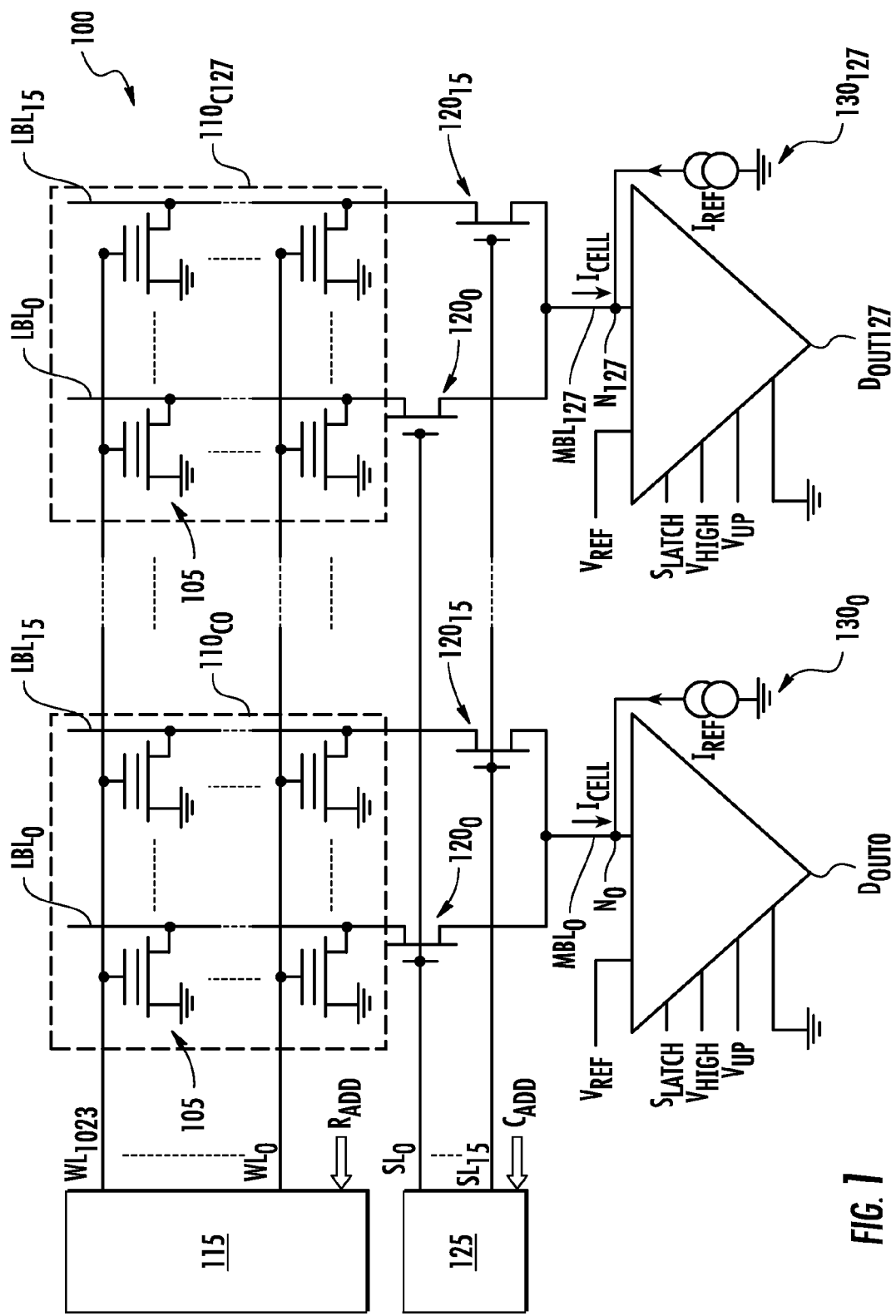
FIG. 1 is a schematic diagram illustrating a non-volatile memory device according to an embodiment of the invention.

With particular reference to FIG. 1, a non-volatile memory device 100 (e.g., a NOR flash memory device) according to an embodiment of the invention is shown. For the sake of exposition brevity, only components and aspects of the memory device 100 relevant to the understanding of the invention will be introduced and described in the following.

The memory device 100 includes a matrix of memory cells 105 (for example, flash memory cells). Each memory cell 105, comprising an N-channel MOS transistor with floating gate structure, is adapted to store a logical value (for example, a high logic value "1" or a low logic value "0") according to an electric charge in the floating gate (which defines a corresponding value of the threshold voltage of the transistor). For example, each memory cell 105 can be programmed at a high threshold voltage (electric charges being trapped in the floating gate) to store the low logic value, or erased at a low threshold voltage (floating gate free from electric charges) to store the high logic value. As should be known, during a reading operation of a selected memory cell 105, the channel current flowing through it (depending on its threshold voltage) can be used to determine the logical value being stored.

As illustrated, the memory cells 105 are arranged (in the matrix) in rows (for example, N=1024 rows) and columns. The columns of the matrix are divided into groups of columns 110Cj (j=0, 1, . . . , M, for example M=127), each one comprising a plurality of columns (for example, 2=16 columns) of adjacent memory cells 105. The memory cells 105 of each column are associated with a respective local bit line LBLk (k=0, 1, . . . , P−1), whereas each group of columns 110Cj is associated with a respective main bit line MBLj.

The memory device 100 comprises a row selection block and a column selection block for the selection of a memory cell 105 of each group of columns 110Cj. The row selection block comprises a plurality of word lines WLi (i=0, 1, . . . , N−1), each one connected to the control terminals of the memory cells 105 arranged along a same row of the matrix, and a row decoder 115, which receives a row address RADD of the memory cell 105 to be selected and biases the corresponding word line WLi.

The column selection block comprises, for each k-th column of each group of columns 110Cj, a column selector 120k operable to enable the connection between the local bit line LBLk and the corresponding main bit line MBLj, and a column decoder 125, which receives a column address CADD of the memory cell 105 to be selected and, for each group of columns 110Cj, activates the corresponding column selector 120k. In the exemplary considered embodiment, each column selector 120k comprises an N-channel MOS transistor with the source and drain terminals connected to the local bit line LBLk and to the main bit line MBLj, respectively, and a control terminal for its activation. For this purpose, the column selection block comprises a plurality of selection lines SLk, each one being connected to the control terminal of the column selector 120k in the k-th column of each group of columns 110Cj (so that the column decoder 125, by biasing the selection line SLk corresponding to the received column address CADD, activates all the column selectors 120k that, in the respective group of columns 110Cj, are located in the k-th column).

The memory device 100 further comprises a plurality of sense amplifiers 130j (e.g. identical sense amplifiers), each one being connected (through a corresponding comparison node Nj) to a respective main bit line MBLj. As conceptually represented in the figure, during a reading operation each sense amplifier 130j is configured to compare, at the respective comparison node Nj, a conduction current ICELL of the selected memory cell 105 with a reference current IREF and, according to the result of such comparison, to provide a latched binary data DOUTj indicative of the logic level stored in the memory cell 105.

As will be discussed below, the sense amplifier 130j features an architecture that allows using, during a reading operation, a reference (e.g., voltage) value VREF, and (unlike the known solutions) only one phase signal (i.e., the phase signal SLATCH, which is generated in a corresponding signals generation block, not shown). The use of a single phase signal, in place of the relatively large number of phase signals (typically four or more) usually needed to control the sense amplifier 130j during the reading operation, simplifies the design of the signals generation block (both in terms of achievable performance, and in terms of area occupation). Moreover, in case of a single phase signal, the configuration times and the times for testing the corresponding timings are greatly reduced. This results in a reduction of the production costs of the memory device 100, and an increase of its reliability (as the likelihood of introducing errors in the design, configuration and/or test phases is reduced).

Although the sense amplifier 130j has been designed to operate at relatively low supply voltages (i.e., between an upper supply voltage VUP, or voltage VUP—for example, between 1.2 V and 1.8 V with respect to a ground voltage of 0V—and a lower supply voltage—for example, equal to the ground voltage), it receives as input also a relatively high voltage (or voltage VHIGH, typically 3.3V-5V with respect to ground voltage). As will be clarified in the following, such voltage VHIGH is used by the sense amplifier 130j to obtain a regulated upper supply voltage (for example, between 1.2 V and 1.8 V)—in the following, voltage VUP,REG—adapted to supply critical circuit stages. This allows avoiding malfunction (for example, errors of the reading operation) in the presence of noise and/or unwanted fluctuations of the voltage VUP, without complicating, at the same time, the structure of the memory device 100 (indeed, the voltage VHIGH is typically already available for other components of the memory device 100—for example, high-voltage transistors and switches, and/or charge pumps).

Figure 2:
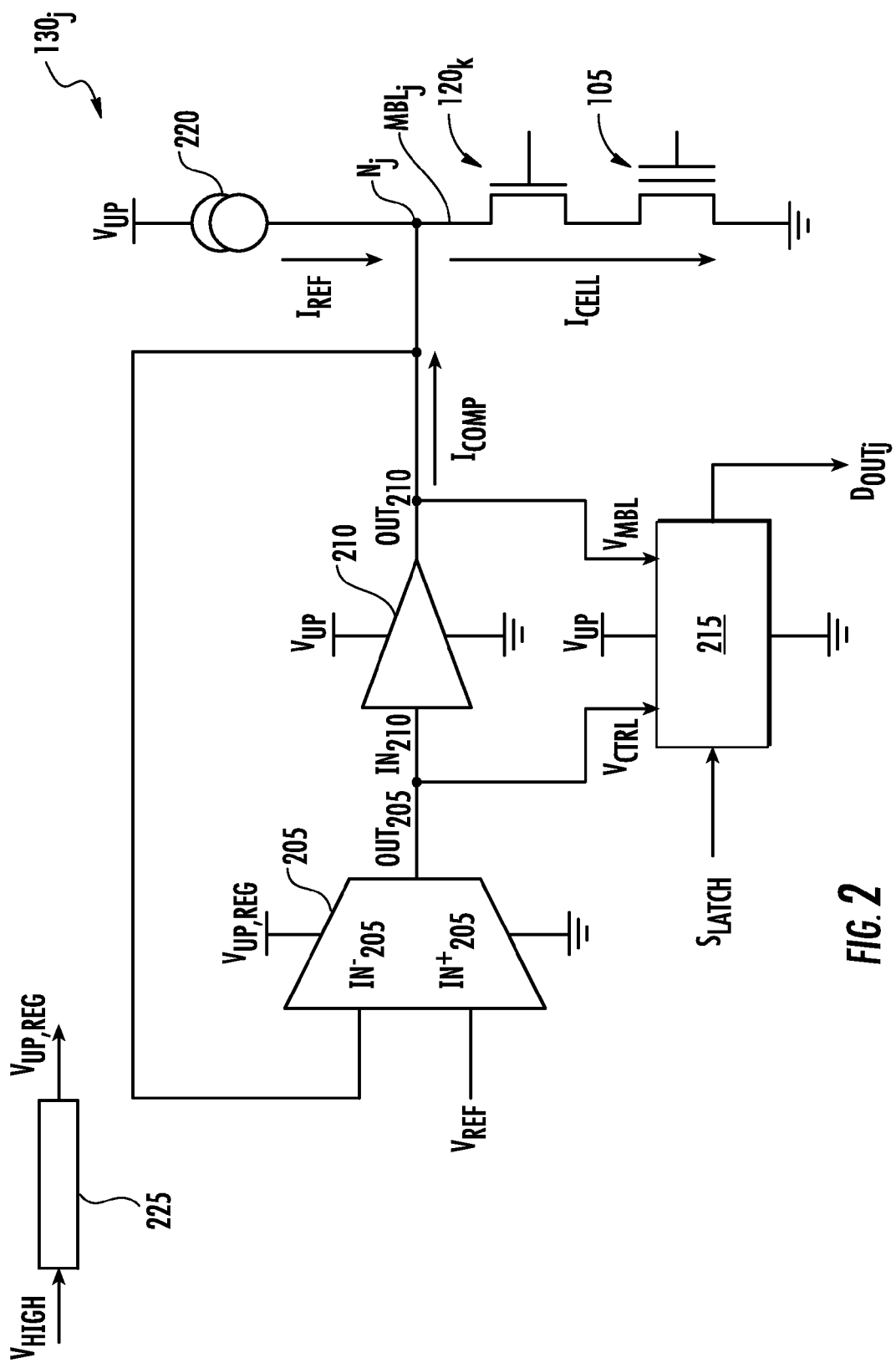
FIG. 2 is a schematic diagram illustrating a block representation of a sense amplifier according to an embodiment of the invention.

FIG. 2 schematically shows a block representation of the sense amplifier 130j according to an embodiment of the invention. For the sake of completeness, a memory cell 105 and a column selector 120k are also shown in such figure.

The sense amplifier 130j comprises an amplification stage 205 having a non-inverting input terminal IN205+ for receiving the reference value VREF, an inverting input terminal IN205− connected to the comparison node Nj for receiving a voltage of the main bit line MBLj (in the following, bit line voltage VMBL), and an output terminal OUT205 for providing a control voltage VCTRL according to the bit line voltage VMBL and the reference value VREF. As described in more detail below, the control voltage VCTRL and the bit line voltage VMBL are used as comparison voltages for discriminating the logic level, high or low, stored in the memory cell 105.

The sense amplifier 130j further comprises a buffer stage 210 for decoupling the control voltage VCTRL and the bit line voltage VMBL from each other. For this purpose, the buffer stage 210 has an input terminal IN210 connected to the output terminal OUT205 of the amplification stage 205 (so as to be controlled by the control signal VCTRL), and an output terminal OUT210 connected to the comparison node Nj (and therefore to the main bit line MBLj and to the inverting input terminal IN205− of the amplification stage 205) for providing a comparison current ICOMP according to a difference between the conduction current ICELL and the reference current IREF.

The connection between the amplification stage 205 and the buffer stage 210 defines a negative feedback configuration. As will be also discussed in the following, this configuration allows stabilizing, for the entire duration of the reading operation, the bit line voltage VMBL at the reference value VREF and the control voltage VCTRL at a comparison value unbalanced with respect to the reference value VREF according to the comparison current ICOMP. This is achieved without using any dedicated phase signals (unlike the known approaches, which require the use of discharge, pre-charge and equalization signals to initialize the main bit line MBLj).

The sense amplifier 130j also comprises a latching stage 215 for receiving the phase signal SLATCH, the control voltage VCTRL and the bit line voltage VMBL, and for providing, in a reading time window defined by the phase signal SLATCH, the latched binary data DOUTj according to a difference between the control voltage VCTRL and the bit line voltage VMBL. As will be better discussed in the following, this time window is delayed, with respect to the start of the reading operation, by such an extent to allow detecting this difference only after the stabilization of the bit line voltage VMBL at the reference value VREF and of the control voltage VCTRL at the comparison value. This allows achieving a sense amplifier 130j with high stability and efficiency.

The sense amplifier 130j finally comprises a current generator 220 connected to the comparison node Nj (and therefore to the main bit line MBLj) for providing the reference current IREF, and a voltage regulator 225 for receiving the voltage VHIGH and providing the voltage VUP,REG (regulated and scaled with respect to it). In the illustrated embodiment, the voltage VUP,REG is used supply only the amplification stage 205 (which has more criticalities from the supply point of view), whereas the buffer stage 210, the latching stage 215 and the current generator 220 are supplied, as in the known approaches, by the voltage VUP. Anyway, since the amplification stage 205 is the circuit stage that has lower current and power consumptions, design and sizing of the voltage regulator 225 are simple.

Figure 3:
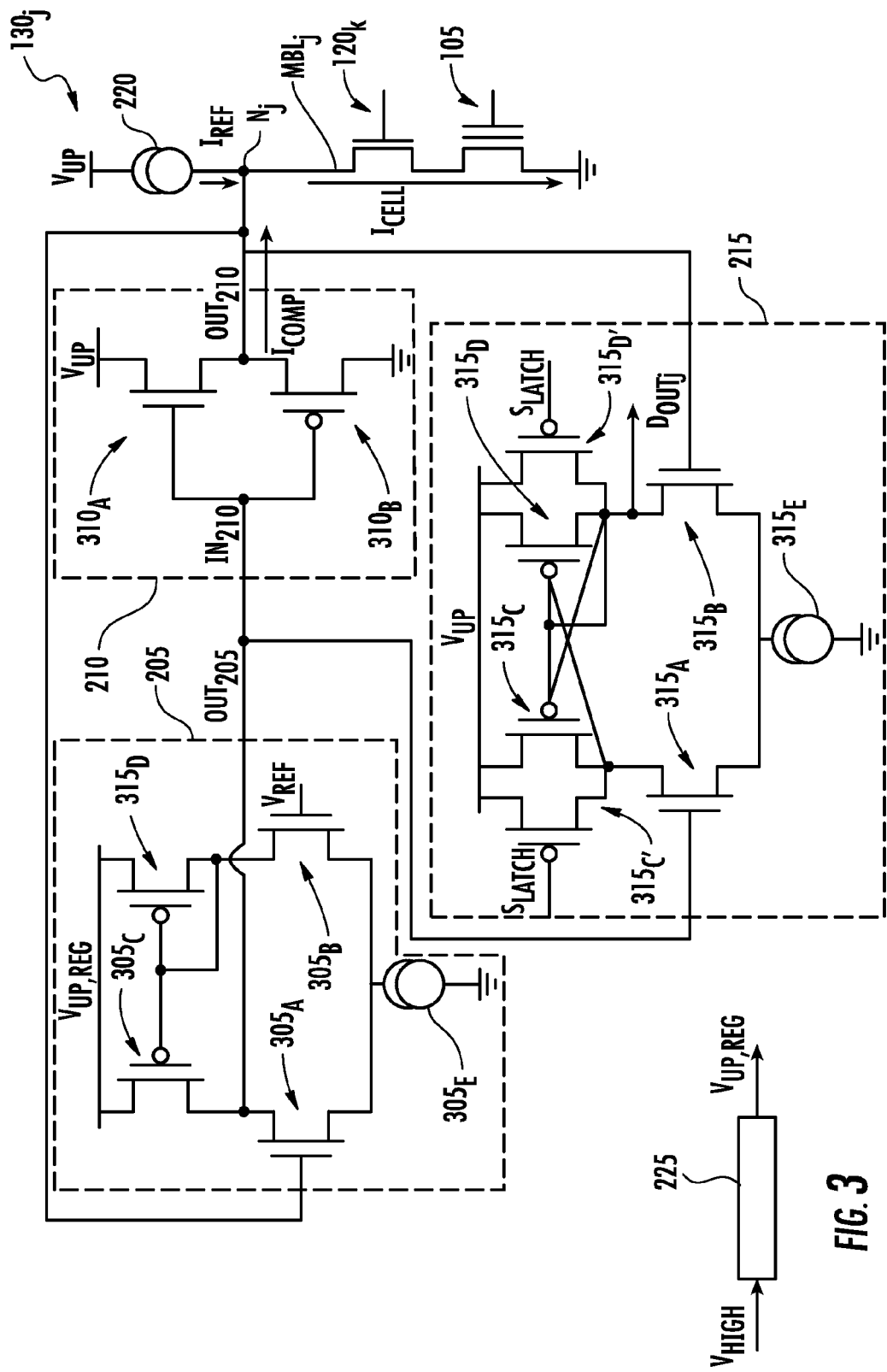
FIG. 3 is a schematic diagram illustrating a circuit implementation of the sense amplifier of FIG. 2 according to an embodiment of the invention.

FIG. 3 shows, according to an embodiment of the invention, an exemplary circuit implementation (for example, by transistors) of the sense amplifier 130j with current generator 220 and voltage regulator 225, for example. Since, as previously mentioned, the sense amplifier 130j is designed to operate at low supply voltages, the transistors which will be referred to herebelow are intended as low voltage transistors.

The amplification stage 205 comprises an input stage for receiving the reference value VREF and the bit line voltage VMBL. More particularly, the input stage comprises an input transistor 305A (for example, an N-channel MOS transistor) having a source terminal, a drain terminal and a gate terminal, and another input transistor 305B equal to the input transistor 305A. The input transistors 305A, 305E are connected to each other in a differential configuration, i.e. with the source terminal of the input transistor 305A that is connected to the source terminal of the input transistor 305B, and with the gate terminals of the input transistors 305A, 305B that implement the input terminals IN205−, IN205+, respectively, of the amplification stage 205.

The amplification stage 205 further comprises a biasing current generator 305E of known type, which is connected to the source terminals of the input transistors 305A, 305B, and a load stage, which in general fulfills biasing functions and, at the same time, active load functions. More particularly, the load stage comprises two load transistors 305C, 305D (for example, P-channel MOS transistors) connected to each other in a current mirror configuration (i.e., with the source terminals that receive the voltage VUP, REG, the drain terminals connected to the drain terminals of the input transistors 305A, 305B, respectively, and the gate terminals connected to the drain terminal of the load transistor 305D). Therefore, the drain terminal of the load transistor 305C, which implements the output terminal OUT205 of the amplification stage 205, provides the control voltage VCTRL amplified (according to an impedance exhibited by the current mirror 305C, 305D) with respect to the difference between the bit line voltage VMBL and the reference value VREF.

The buffer stage 210 comprises a buffer transistor 310A (for example, an N-channel MOS transistor) and a further buffer transistor 310B (for example, a P-channel MOS transistor) connected in complementary source-follower configuration. In this configuration, the gate and source terminals of the buffer transistor 310A are connected the gate and source terminals of the buffer transistor 310B, respectively, whereas the drain terminals of the buffer transistors 310A and 310B receive the voltage VUP and the ground voltage, respectively.

The gate and source terminals of the buffer transistors 310A, 310B are also connected to the output terminal OUT205 of the amplification stage 205 and to the comparison node Nj (and therefore to the main bit line MBLj), respectively, thus they implement the input IN210 and output OUT210 terminals of the buffer stage 210.

By virtue of the complementary source-follower configuration, and for the effect of the negative feedback, the buffer transistors 310A, 310B are turned on alternately according to a polarity (i.e., sign or direction) of the comparison current ICOMP, for example, a positive polarity (with the comparison current ICOMP flowing into the comparison node Nj) if the reference current IREF is lower than the conduction current ICELL, or a negative polarity (with the comparison current ICOMP flowing from the comparison node Nj) if the reference current IREF is higher than the conduction current ICELL. This allows obtaining a comparison value that, compared to the reference value VREF, varies according to the polarity of the comparison current ICOMP. In particular, the buffer transistor 310A is turned on if the comparison current ICOMP has the positive polarity, in which case the comparison value is higher than the reference value VREF by a threshold voltage VthA of the buffer transistor 310A (i.e., VREF+VthA), or the buffer transistor 310B is turned on if the comparison current ICOMP has the negative polarity, in which case the comparison value is lower than the reference value VREF by a threshold voltage VthB of the buffer transistor 310B (i.e., VREF−VthB).

The latching stage 215 comprises a latching section for receiving the comparison value and the reference value VREF and providing the binary data DOUTj (e.g., latched at the voltage VUP if the control voltage VCTRL is stabilized at the comparison value VREF+VthA, or at the ground voltage if the control voltage VCTRL is stabilized at the comparison value VREF−VthB), and a control section for activating the latching section only during the predefined time window. In the exemplary illustrated embodiment, the latching section 215 has a further input section (similar to the input section of the amplification stage 205) comprising two additional input transistors 315A, 315B (for example, N-channel MOS transistors) for receiving (at the respective gate terminals), the bit line voltage VMBL (that, during the reading time window, is at the reference value VREF) and the control voltage VCTRL (that, during the reading time window, is at the comparison value VREF+VthA or at the comparison value VREF−VthB) and for providing (at the drain terminal of the input transistor 315B) the data DOUTj. A further biasing current generator 315E (similar to the biasing current generator 305E) is connected to the source terminals of the input transistors 315A, 315B, and two latching transistors 315C, 315D (for example, P-channel MOS transistors) are connected to each other in a semi-latch configuration (i.e., with the source terminals that receive the voltage VUP, the drain terminals connected to the drain terminals of the input transistors 315A, 315B, respectively, and the gate terminals connected to the drain terminals of the latching transistors 315C, 315D, respectively).

In the exemplary illustrated embodiment, the control section comprises two control transistors 315C', 315D' (for example, P-channel MOS transistors), which are connected in parallel to the latching transistors 315C, 315D, respectively, and receive (at their gate terminals) the phase signal SLATCH. The phase signal SLATCH is configured to take a de-asserted state (for example, equal to the ground voltage) wherein the control transistors 315C', 315D' are turned on, and an asserted state (for example, equal to the voltage VUP) wherein the control transistors 315C', 315D' are turned off, with the reading time window that is defined, as will become clear shortly, by a duration of the asserted state of the phase signal SLATCH.

Naturally, although not explicitly stated, the sizing of the transistors, non-limiting for the invention, should be chosen according to specific design requirements (for example, in such a way as to ensure adequate access times). The proposed implementation is advantageous as it allows using only one phase signal, and a reduced number (and simple configurations) of transistors.

Figure 4:
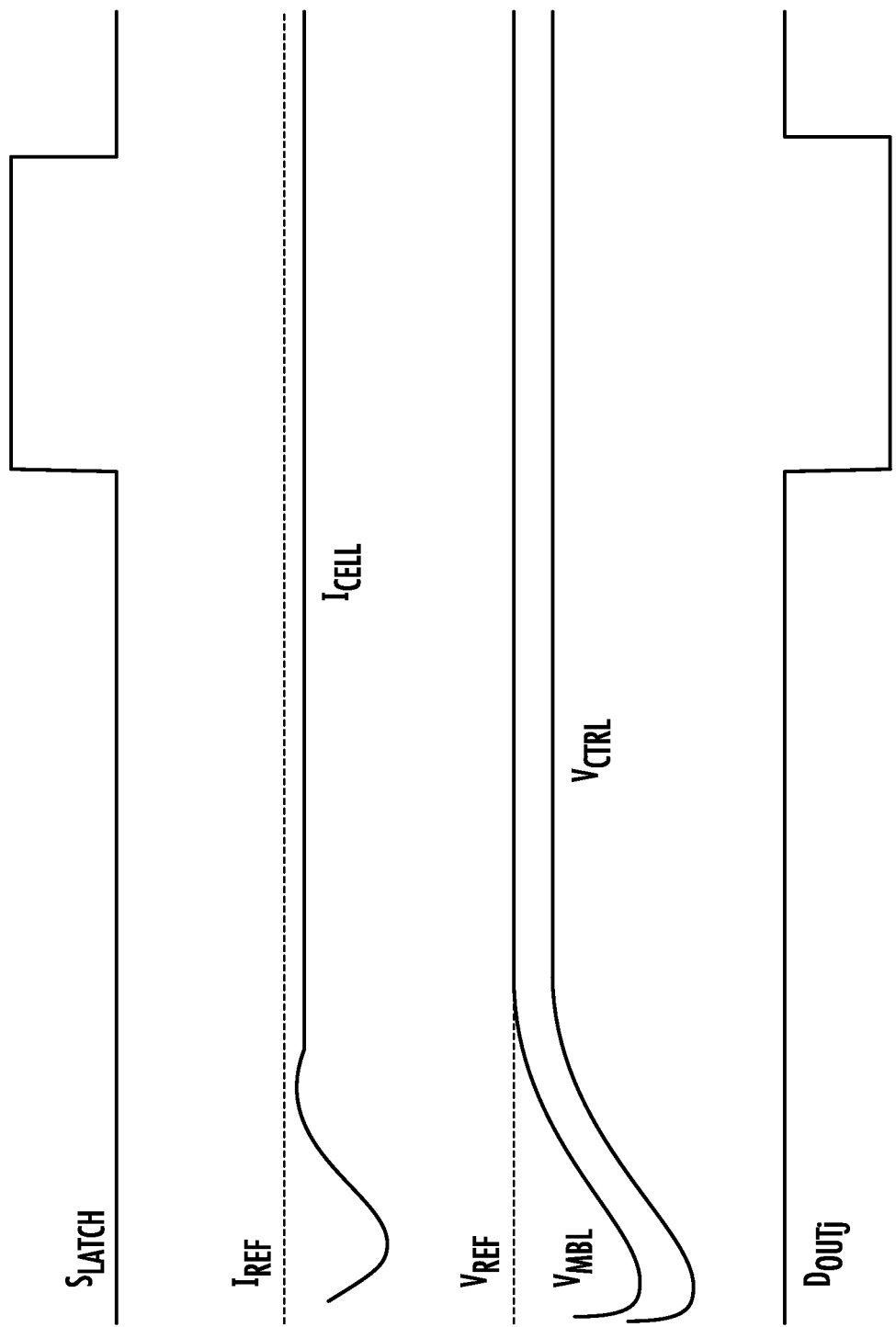
FIG. 4 is a qualitative time diagram of some significant signals of the memory device during a reading operation of a programmed memory cell, according to an embodiment of the invention.

The operation of the sense amplifier 130j can be summarized as follows (with further reference to FIG. 4, which shows a qualitative time diagram of the phase signal SLATCH, the bit line voltage VMBL, the conduction current ICELL, the control voltage VCTRL and the output data DOUTj during a reading operation of a programmed memory cell, according to an embodiment of the invention). At the start of the reading operation (memory cell 105 being selected), the phase signal SLATCH is de-asserted, the output data DOUTj is at the voltage VUP (as the control transistors 315C', 315D', being turned on, force the voltage VUP at their drain terminals regardless of the bit line voltage VMBL and the control voltage VCTRL at their gate terminals), whereas the bit line voltage VMBL (and thus the control voltage VCTRL) is at an unpredictable initial value (for example, between 0V and 1V).

In the case that the bit line voltage VMBL is higher than the reference value VREF, the voltage unbalance at the input terminals IN205+, IN205− of the amplification stage 205 will produce a control signal VCTRL able to turn on the buffer transistor 310B (buffer transistor 310A being off). The turning on of the buffer transistor 310B causes the bit line voltage VMBL to decrease down to the ground voltage. Such decrease stops as soon as the bit line voltage VMBL has reached the reference value VREF (condition wherein the amplification stage has, at both its input terminals IN205+, IN205−, the reference value VREF). As a result of the negative feedback, the reference value VREF will be stably maintained at the main bit line MBLj for the entire duration of the reading operation.

Instead, in the case that the bit line voltage VMBL is lower than the reference value VREF (scenario illustrated in FIG. 4), the voltage unbalance at the input terminals IN205+, IN205− of the amplification stage 205 will produce a control signal VCTRL able to turn on the buffer transistor 310A (buffer transistor 310E being off). The turning on of the buffer transistor 310A causes the bit line voltage VMBL to increase up to the voltage VUP. Similarly to what discussed above, this increase stops as soon as the bit line voltage VMBL has reached the reference value VREF.

It should be noted that, in the meantime, the binary data DOUTj is still at the value of the voltage VUP (since the phase signal SLATCH is still de-asserted), whereas the conduction current ICELL is "modulated" according to the bit line voltage VMBL at its drain terminal (i.e., it is not yet at its steady state value, valid for determining, according to the comparison with the reference current IREF, the logic level stored in the memory cell 105). The stabilization of the bit line voltage VMBL at the reference value VREF also causes the stabilization of the conduction current ICELL at its steady state value (which is different in the cases of deleted or programmed memory cell 105).

In the case of an erased memory cell 105, the conduction current ICELL is higher than the reference current IREF (comparison current ICOMP with positive polarity flowing through the buffer transistor 310A). The control voltage VCTRL then takes the comparison value VREF+VthA such as to keep the buffer transistor 310A on (and the buffer transistor 310B off). Instead, in the case of a programmed memory cell 105 (as herein assumed by way of example), the conduction current ICELL is lower than the reference current IREF (comparison current ICOMP with negative polarity flowing through the buffer transistor 310B). The control voltage VCTRL then takes the comparison value VREF−VthB such as to keep the buffer transistor 310B on (and the buffer transistor 310A off).

At this point, the phase signal SLATCH is asserted (activation of the reading time window). This causes the shutdown of the control transistors 315C', 315D'. In this condition, the latching stage 215 is active, and latches, in a known manner, the data DOUTj (at the value of the ground voltage, as shown, or of the voltage VUP) according to the unbalance between the comparison value (VREF−VthB, as in the example at issue, or VREF+VthA) and the reference value VREF. Finally, the phase signal SLATCH is de-asserted again. This determines the end of the reading time window (with the data DOUTj that returns to the value of the voltage VUP).

As will be understood, such approach, particularly suitable for use in non-volatile memory devices, can also be used in all integrated electronic devices having problems similar to those above discussed, namely, the presence of current signals that, being associated with capacitive nodes at unknown initial values and being referred to low supply voltages, may require irregular approaches for their monitoring.

Naturally, to satisfy local and specific requirements, a person skilled in the art may apply to the approach described above many logical and/or physical modifications and alterations. More specifically, although this approach has been described with a certain degree of particularity with reference to one or more embodiments thereof, it should be understood that various omissions, substitutions and changes in the form and details as well as other embodiments are possible. Particularly, different embodiments of the invention may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed approach may be incorporated in any other embodiment as a matter of general design choice.

For example, an aspect of the approach according to embodiments of the invention proposes a non-volatile memory device comprising a sense amplifier for comparing, at a comparison node, a conduction current of a selected one of a plurality of memory cells of the memory device with a reference current. The sense amplifier comprises an amplification stage having a first input terminal connected to the comparison node for receiving a first comparison voltage, a second input terminal for receiving a reference value, and an output terminal for providing a second comparison voltage according to the first comparison voltage and to the reference value. The sense amplifier also comprises a buffer stage having an output terminal connected to the comparison node for providing a comparison current according to a difference between the conduction current and the reference current, and an input terminal connected to the output terminal of the amplification stage for stabilizing the first comparison voltage at the reference value and the second comparison voltage at a comparison value unbalanced with respect to the reference value according to the comparison current. The sense amplifier further comprises a latching stage for providing a latched binary data indicative of a logic level stored in the memory cell according to a difference between said comparison value and said reference value.

Similar considerations apply if the memory device has a different structure or comprises equivalent components, or has other operating features. In any case, any component thereof can be separated into several elements, or two or more components can be combined in a single element; in addition, each component may be replicated to support the execution of the corresponding operations in parallel. It is also pointed out that (unless specified otherwise) any interaction between different components generally does not need to be continuous, and may be direct or indirect through one or more intermediaries.

For example, although in the description reference has been made to a memory device having a NOR architecture, this should not be understood limitatively. Indeed, the principles of the invention can be similarly applied to other types of architectures (e.g., NAND architecture).

According to an embodiment of the invention, the comparison current has a first polarity if the reference current is lower than the conduction current, or a second polarity if the reference current is higher than the conduction current, said comparison value comprising a first comparison value if the comparison current has the first polarity or a second comparison value if the comparison current has the second polarity. Anyway, it is possible to provide circuit configurations wherein the polarity of the comparison current depends in a different way on the reference current and on the conduction current, and/or wherein the first and the second comparison values depend in a different way on the polarity the comparison current.

According to an embodiment of the invention, the buffer stage comprises a first buffer transistor of a first type of conductivity having a drain terminal for receiving an upper supply voltage, a source terminal and a gate terminal, and a second buffer transistor of a second type of conductivity having a drain terminal for receiving a lower supply voltage, a gate terminal connected to the gate terminal of the first buffer transistor and a source terminal connected to the source terminal of the first buffer transistor, the gate and source terminals of the first and second buffer transistors implementing said input and output terminals, respectively, of the buffer stage. The first buffer transistor and the second buffer transistor are turned on alternately according to the polarity of the comparison current. Anyway, nothing prevents from implementing the buffer stage by any other configuration suitable for the purpose.

According to an embodiment of the invention, the first buffer transistor is turned on if the comparison current has the first polarity (with said first comparison value that is higher than said reference value by a threshold voltage of the first buffer transistor), or the second buffer transistor is turned on if the comparison current has the second polarity (with said second comparison value that is lower than said reference value by a threshold voltage of the second buffer transistor). Anyway, it is possible to provide (and exploit for other purposes) operating conditions wherein the buffer transistors are both turned off (for example, for power saving), or both turned on.

According to an embodiment of the invention, the latching stage comprises a latching section for receiving the comparison value and the reference value and providing said latched binary data, the binary data being latched at the upper supply voltage if the second comparison voltage is stabilized at the first comparison value, or at the lower supply voltage if the second comparison voltage is stabilized at the second comparison value, and a control section for activating the latching section only during a predefined time window.

According to an embodiment of the invention, the latching section comprises a first input transistor of the first type of conductivity having a gate terminal for receiving said comparison value, a source terminal for receiving the lower supply voltage, and a drain terminal. A second input transistor of the second type of conductivity has a gate terminal for receiving the second comparison voltage, a source terminal connected to the source terminal of the first input transistor, and a drain terminal for providing the latched data. A first latching transistor of the second type of conductivity has a source terminal for receiving the upper supply voltage, a drain terminal connected to the drain terminal of the first input transistor, and a gate terminal. A second latching transistor of the second type of conductivity has a source terminal for receiving the upper supply voltage, a drain terminal connected to the drain terminal of the second input transistor, and a gate terminal connected to the drain terminal of the first input transistor. Anyway, the latching section can be implemented in any other equivalent manner.

According to an embodiment of the invention, the control section comprises a first control transistor of the second type of conductivity having source and drain terminals connected to the source and drain terminals of the first latching transistor, respectively, and a gate terminal for receiving a phase signal. A second control transistor of the second type of conductivity has source and drain terminals connected to the source and drain terminals of the second latching transistor, respectively, and a gate terminal for receiving the phase signal. The phase signal is configured to take a de-asserted state wherein the first and the second control transistors are turned on for inhibiting the latching section, and an asserted state wherein the first and the second control transistors are turned off for activating the latching section. A duration of the asserted state of the phase signal determines the predefined time window. Anyway, the control section can be implemented in any other equivalent manner.

According to an embodiment of the invention, the sense amplifier further comprises a voltage regulator for receiving a first voltage with respect to a ground voltage and providing a second voltage lower than the first voltage and regulated with respect to the upper supply voltage, the second voltage and the ground voltage acting as additional upper supply voltage and lower supply voltage, respectively, of the amplification stage. However, the voltage regulator can also be omitted in a basic implementation. To reduce the area occupation of the memory device, it is also possible to provide the use of a voltage regulator shared by two or more sense amplifiers (for example, all of the sense amplifiers of the memory device).

According to an embodiment of the invention, the plurality of memory cells are arranged in rows and groups of columns each one comprising a plurality of columns of memory cells. The sense amplifier comprises a plurality of sense amplifiers each one associated with a respective group of columns. Anyway, nothing prevents from associating each sense amplifier to multiple groups of columns. Additionally or alternatively, different groups of columns may share one or more sense amplifiers.

Another aspect of the approach according to embodiments of the invention proposes a method for comparing, at a comparison node, a conduction current of a selected one of a plurality of memory cells of a memory device with a reference current. The method comprises receiving a first comparison voltage at the comparison node, and a reference value, and providing a second comparison voltage according to a difference between the first comparison voltage and the reference value, providing a comparison current according to a difference between the conduction current and the reference current, and stabilizing the first comparison voltage at the reference value and the second comparison voltage at a comparison value unbalanced with respect to the reference value according to the comparison current, and providing a latched binary data indicative of a logic level stored in the memory cell according to a difference between the comparison value and the reference value.

Anyway, the approach according to an embodiment of the invention lends itself to be implemented through an equivalent method (by using similar steps, removing some non-essential steps, or adding additional optional steps); moreover, the steps may be performed in a different order, in parallel or overlapped (at least in part).

That which is claimed is:

1. A memory device comprising:
    a plurality of memory cells;
    a comparison node;
    at least one sense amplifier configured to compare, at the comparison node, a conduction current of a selected one of the plurality of memory cells with a reference current, and comprising
        an amplification stage having a first input terminal coupled to the comparison node configured to receive a first comparison voltage, a second input terminal configured to receive a reference value, and an output terminal configured to provide a second comparison voltage based upon the first comparison voltage and the reference value,
        a buffer stage having an output terminal coupled to the comparison node configured to provide a comparison current according to a difference between the conduction current and the reference current, and an input terminal coupled to the output terminal of the amplification stage configured to stabilize the first comparison voltage at the reference value and the second comparison voltage at a comparison value unbalanced with respect to the reference value according to the comparison current, and
        a latching stage configured to provide latched binary data indicative of a logic level stored in the memory cell according to a difference between the comparison value and the reference value.

2. The memory device according to claim 1, wherein the comparison current has a first polarity when the reference current is lower than the conduction current, and a second polarity when the reference current is higher than the conduction current, the comparison value comprising a first comparison value when the comparison current has the first polarity and a second comparison value when the comparison current has the second polarity.

3. The memory device according to claim 2, wherein the buffer stage comprises:
    a first buffer transistor of a first type of conductivity having a drain terminal configured to receive an upper supply voltage, a source terminal and a gate terminal; and
    a second buffer transistor of a second type of conductivity having a drain terminal configured to receive a lower supply voltage, a gate terminal coupled to the gate terminal of the first buffer transistor and a source terminal coupled to the source terminal of the first buffer transistor, the gate and source terminals of the first and second buffer transistors defining the input and output terminals, respectively, of the buffer stage;
    wherein the first buffer transistor and the second buffer transistor are turned on alternately based upon the polarity of the comparison current.

4. The memory device according to claim 3, wherein the first buffer transistor is turned on when the comparison current has the first polarity, the first comparison value being higher than the reference value by a threshold voltage of the first buffer transistor; and wherein the second buffer transistor is turned on when the comparison current has a second polarity, the second comparison value being lower than the reference value by a threshold voltage of the second buffer transistor.

5. The memory device according to claim 4, wherein the latching stage comprises:
    a latching section configured to receive the comparison value and the reference value and to provide the latched binary data, the binary data being latched at the upper supply voltage when the second comparison voltage is stabilized at the first comparison value, and at the lower supply voltage when the second comparison voltage is stabilized at the second comparison value; and
    a control section configured to activate the latching section during a time window.

6. The memory device according to claim 5, wherein the latching section comprises:
    a first input transistor of the first type of conductivity having a gate terminal configured to receive the comparison value, a source terminal to receive the lower supply voltage, and a drain terminal;
    a second input transistor of the second type of conductivity having a gate terminal configured to receive the second comparison voltage, a source terminal coupled to the source terminal of the first input transistor, and a drain terminal to provide the latched data;
    a first latching transistor of the second type of conductivity having a source terminal configured to receive the upper supply voltage, a drain terminal coupled to the drain terminal of the first input transistor, and a gate terminal; and
    a second latching transistor of the second type of conductivity having a source terminal configured to receive the upper supply voltage, a drain terminal coupled to the drain terminal of the second input transistor, and a gate terminal coupled to the drain terminal of the first input transistor.

7. The memory device according to claim 6, wherein the control section comprises:
    a first control transistor of the second type of conductivity having source and drain terminals coupled to the source and drain terminals of the first latching transistor, respectively, and a gate terminal configured to receive a phase signal; and
    a second control transistor of the second type of conductivity having source and drain terminals coupled to the source and drain terminals of the second latching transistor, respectively, and a gate terminal configured to receive the phase signal;
    wherein the phase signal is configured to take a de-asserted state wherein the first and the second control transistors are turned on to inhibit the latching section, and an asserted state wherein the first and the second control transistor are turned off to activate the latching section, a duration of the asserted state of the phase signal determining the time window.

8. The memory device according to claim 1, further comprising a voltage regulator configured to receive a first voltage with respect to a ground voltage and provide a second voltage lower than the first voltage and regulated with respect to an upper supply voltage, the second voltage and the ground voltage acting as a further upper supply voltage and lower supply voltage, respectively, of the amplification stage.

9. The memory device according to claim 1, wherein the plurality of memory cells are arranged in rows and groups of columns each group comprising a plurality of columns of memory cells, and wherein the at least one sense amplifier comprises a plurality of sense amplifiers each one associated with a respective group of columns.

10. A memory device comprising:
a plurality of memory cells;
a sense amplifier configured to compare a conduction current of a selected one of the plurality of memory cells with a reference current, and comprising
an amplification stage having a first input terminal configured to receive a first comparison voltage, a second input terminal configured to receive a reference value, and an output terminal configured to provide a second comparison voltage,
a buffer stage having an output terminal configured to provide a comparison current based upon a difference between the conduction current and the reference current, and an input terminal coupled to the output terminal of the amplification stage configured to stabilize the first comparison voltage at the reference value and the second comparison voltage at a comparison value unbalanced with respect to the reference value according to the comparison current, and
a latching stage configured to indicate a logic level stored in the memory cell based upon a difference between the comparison value and the reference value.

11. The memory device according to claim 10, wherein the comparison current has a first polarity when the reference current is lower than the conduction current, and a second polarity when the reference current is higher than the conduction current, the comparison value comprising a first comparison value when the comparison current has the first polarity and a second comparison value when the comparison current has the second polarity.

12. The memory device according to claim 11, wherein the buffer stage comprises:
a first buffer transistor having a drain terminal configured to receive an upper supply voltage, a source terminal and a gate terminal; and
a second buffer transistor having a drain terminal configured to receive a lower supply voltage, a gate terminal coupled to the gate terminal of the first buffer transistor and a source terminal coupled to the source terminal of the first buffer transistor, the gate and source terminals of the first and second buffer transistors defining the input and output terminals, respectively, of the buffer stage;
wherein the first buffer transistor and the second buffer transistor are turned on alternately based upon the polarity of the comparison current.

13. The memory device according to claim 12, wherein the first buffer transistor is turned on when the comparison current has the first polarity, the first comparison value being higher than the reference value by a threshold voltage of the first buffer transistor; and wherein the second buffer transistor is turned on when the comparison current has a second polarity, the second comparison value being lower than the reference value by a threshold voltage of the second buffer transistor.

14. The memory device according to claim 13, wherein the latching stage comprises:
a latching section configured to receive the comparison value and the reference value and to provide a binary data being latched at the upper supply voltage when the second comparison voltage is stabilized at the first comparison value, and at the lower supply voltage when the second comparison voltage is stabilized at the second comparison value; and
a control section configured to activate the latching section during a predefined time window.

15. The memory device according to claim 14, wherein the latching section comprises:
a first input transistor having a gate terminal configured to receive the comparison value, a source terminal to receive the lower supply voltage, and a drain terminal;
a second input transistor having a gate terminal configured to receive the second comparison voltage, a source terminal coupled to the source terminal of the first input transistor, and a drain terminal configured to provide the latched data;
a first latching transistor having a source terminal configured to receive the upper supply voltage, a drain terminal coupled to the drain terminal of the first input transistor, and a gate terminal; and
a second latching transistor having a source terminal configured to receive the upper supply voltage, a drain terminal coupled to the drain terminal of the second input transistor, and a gate terminal coupled to the drain terminal of the first input transistor.

16. The memory device according to claim 15, wherein the control section comprises:
a first control transistor having source and drain terminals coupled to the source and drain terminals of the first latching transistor, respectively, and a gate terminal configured to receive a phase signal; and
a second control transistor having source and drain terminals coupled to the source and drain terminals of the second latching transistor, respectively, and a gate terminal configured to receive the phase signal;
wherein the phase signal is configured to take a de-asserted state wherein the first and the second control transistors are turned on to inhibit the latching section, and an asserted state wherein the first and the second control transistor are turned off to activate the latching section, a duration of the asserted state of the phase signal determining the time window.

17. The memory device according to claim 10, further comprising a voltage regulator configured to receive a first voltage with respect to a ground voltage and provide a second voltage lower than the first voltage and regulated with respect to an upper supply voltage, the second voltage and the ground voltage acting as a further upper supply voltage and lower supply voltage, respectively, of the amplification stage.

18. The memory device according to claim 10, wherein the plurality of memory cells are arranged in rows and groups of columns each group comprising a plurality of columns of memory cells, and wherein the at least one sense amplifier comprises a plurality of sense amplifiers each one associated with a respective group of columns.

19. A method for comparing, at a comparison node, a conduction current of a selected one of a plurality of memory cells of a memory device with a reference current, the method comprising:

receiving a first comparison voltage at the comparison node, and providing a second comparison voltage based upon a difference between the first comparison voltage and a reference value;

providing a comparison current based upon a difference between the conduction current and the reference current, and stabilizing the first comparison voltage at the reference value and the second comparison voltage at a comparison value unbalanced with respect to the reference value according to the comparison current; and providing latched binary data indicative of a logic level stored in the memory cell based upon a difference between the comparison value and the reference value.

20. The method according to claim 19, wherein the comparison current has a first polarity when the reference current is lower than the conduction current, and a second polarity when the reference current is higher than the conduction current, the comparison value comprising a first comparison value when the comparison current has the first polarity and a second comparison value when the comparison current has the second polarity.

* * * * *